US010707847B2

(12) United States Patent
Han et al.

(10) Patent No.: US 10,707,847 B2
(45) Date of Patent: Jul. 7, 2020

(54) RESISTOR-CAPACITOR OSCILLATOR

(71) Applicant: BEIJING SPREADTRUM HI-TECH COMMUNICATIONS TECHNOLOGY CO., LTD., Beijing (CN)

(72) Inventors: Te Han, Shanghai (CN); Junshi Qiao, Shanghai (CN); Jiewei Lai, Shanghai (CN)

(73) Assignee: BEIJING UNISOC COMMUNICATIONS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 16/184,161

(22) Filed: Nov. 8, 2018

(65) Prior Publication Data
US 2019/0149140 A1 May 16, 2019

(30) Foreign Application Priority Data
Nov. 10, 2017 (CN) .......................... 2017 1 1111787

(51) Int. Cl.
*H03K 4/50* (2006.01)
*H03K 3/0231* (2006.01)
(Continued)

(52) U.S. Cl.
CPC .............. *H03K 4/50* (2013.01); *H03K 3/011* (2013.01); *H03K 3/0231* (2013.01); *H03K 4/502* (2013.01)

(58) Field of Classification Search
CPC ...... H03K 3/0231; H03K 4/502; H03K 3/354; H03K 4/50; H03K 4/501; H03K 3/011; H03L 1/02
See application file for complete search history.

(56) References Cited

U.S. PATENT DOCUMENTS 7,432,771 B2 * 10/2008 Chui ...................... H03K 4/502
331/113 R
7,800,454 B2 * 9/2010 Vanselow .............. H03K 3/011
331/1 R
(Continued)

FOREIGN PATENT DOCUMENTS

CN 103546121 A * 1/2014
CN 107317568 A * 11/2017

OTHER PUBLICATIONS

Wang, Hui, and Patrick P. Mercier. "A reference-free capacitive-discharging oscillator architecture consuming 44.4 pW/75.6 nW at 2.8 Hz/6.4 kHz." IEEE Journal of Solid-State Circuits 51.6 (2016): 1423-1435. (Year: 2016).*

Primary Examiner — Ryan Johnson
(74) Attorney, Agent, or Firm — Cantor Colburn LLP

(57) ABSTRACT

An RC oscillator is provided for improving stability of oscillation frequency. The circuit includes an input module, an oscillating module, an inverting module, first and second compensating modules and an output module, wherein the input module provides two-path charging currents and bias current for the oscillating module; the oscillating module outputs a first high level or a first low level to the inverting module under the control of the two-path charging currents and bias current, and improves frequency tuning accuracy of the oscillator; the inverting module inverts the first high level to a second low level or inverts the first low level to a second high level, and outputs the second low level or the second high level to the output module; the output module outputs the second high level and the second low level; and the first and second compensating modules improve stability of the oscillation frequency.

9 Claims, 4 Drawing Sheets

(51) Int. Cl.
    *H03K 3/011* (2006.01)
    *H03K 4/502* (2006.01)

(56) References Cited

U.S. PATENT DOCUMENTS 9,503,059 B1 * 11/2016 Margarit ................ H03K 3/011
9,584,132 B2 *  2/2017 Kim ......................... H03L 1/02

* cited by examiner

RESISTOR-CAPACITOR OSCILLATOR

CROSS-REFERENCE TO RELATED APPLICATIONS

The present application claims priority under 35 U.S.C. § 119 to Chinese patent application No. 201711111787.9, filed on Nov. 10, 2017, and the entire disclosure of which is incorporated herein by reference.

TECHNICAL FIELD

The present disclosure generally relates to electronic technology field, and more particularly, to a resistor-capacitor (RC) oscillator.

BACKGROUND

In low power consumption communication applications, such as Internet of Things (IoT) or Bluetooth Low Energy (BLE), an RC oscillator is usually used instead of a crystal oscillator as a clock source in a sleep state of a system. To ensure accuracy of sleep timing of the system and reduce extra power consumption introduced by the system guard time, such applications generally have higher requirements on frequency accuracy of the RC oscillator. For example, the BLE requires that a sleep timer has a frequency deviation within 500 ppm.

Here, basic working principle of an RC relaxation oscillator is introduced. A capacitor is charged with a fixed current, and a voltage across the capacitor is compared with a reference voltage by a comparator. When the voltage across the capacitor is greater than the reference voltage, the comparator output is inverted, and the capacitor is discharged. Afterward, the charging is performed. The above process is repeated, so as to obtain a clock output signal with a specific frequency. The frequency of the clock output signal is related to (usually inversely proportional to) resistance and capacitance in the oscillator.

Referring to FIG. 1, FIG. 1 is a relaxation oscillation circuit in existing techniques. The circuit compensates for a mismatch voltage of a comparator by periodically switching positive and negative input terminals of the comparator. When an output clock is low, switches S1, S4 and S6 are turned on, a voltage across a capacitor C2 is 0, a current source charges a capacitor C1, V1 is a voltage across the capacitor C1, and V2 is a reference voltage. When V1 is charged to be greater than V2, an output of the comparator is inverted, and the output clock becomes high. At the time, the switches S2, S3 and S5 are turned on, and the capacitor C1 is discharged to 0 V. The current source charges the capacitor C2, V2 is a voltage across the capacitor C2, and V1 is a reference voltage. When V2 is charged to be greater than V1, the output clock is inverted to be a low level. By analogy, a periodic clock output is generated.

The above solution reduces correlation between frequency and temperature by using a resistor with a lower temperature coefficient. There are three specific ways: 1) using the combination of a resistor with a positive temperature coefficient and a resistor with a negative temperature coefficient to form the resistor with the lower temperature coefficient; 2) using a resistor with an ultra-low temperature coefficient in special processes; 3) using an off-chip resistor with a low temperature coefficient.

SUMMARY

Embodiments of the present disclosure provide an RC oscillator for reducing correlation between oscillating frequency and temperature of the RC oscillator and improving stability of an oscillation frequency of the RC oscillator.

In an embodiment of the present disclosure, an RC oscillator is provided, including an input module, an oscillating module, an inverting module, a first compensating module, a second compensating module and an output module, wherein the input module is connected with the oscillating module, and configured to provide two-path charging currents and a bias current for the oscillating module; the oscillating module is connected with the inverting module, the first compensating module and the second compensating module, and configured to output a first high level or a first low level to the inverting module under the control of the two-path charging currents and the bias current, and improve frequency tuning accuracy of the oscillator; the inverting module is connected with the output module, configured to invert the first high level to a second low level or to invert the first low level to a second high level, and output the second low level or the second high level to the output module; the output module is configured to output the second high level and the second low level and the first compensating module and the second compensating module are configured to improve stability of an oscillation frequency of the oscillator.

Optionally, the input module includes a first current source, a power supply voltage, a first transistor, a second transistor and a third transistor, wherein one end of the first current source is grounded, and the other end of the first current source is connected with a second electrode and a gate of the first transistor, a gate of the second transistor, and a gate of the third transistor, the power supply voltage is connected with a first electrode of the first transistor, a first electrode of the second transistor and a first electrode of the third transistor, a second electrode of the second transistor is connected with a first voltage node of the oscillator, and a second electrode of the third transistor is connected with a second voltage node of the oscillator.

Optionally, the oscillator module includes a first switch transistor, a second switch transistor, a third switch transistor, a fourth switch transistor, a fifth switch transistor, a sixth switch transistor, a first capacitor, a second capacitor, a comparator, an adjustable resistor, a filter capacitor and a Sigma-Delta modulator, wherein a first electrode of the first switch transistor is connected with the first voltage node, and a second electrode of the first switch transistor is connected with a first end of the first capacitor and a first electrode of the fifth switch transistor; the first electrode of the fifth switch transistor is connected with the first end of the first capacitor, and a second electrode of the fifth switch transistor is connected with a second end of the first capacitor; the second end of the first capacitor is grounded; a first electrode of the third switch transistor is connected with the first voltage node, and a second electrode of the third switch transistor is connected with a third voltage node; a first electrode of the fourth switch transistor is connected with the second voltage node, and a second electrode of the fourth switch transistor is connected with the third voltage node; a first electrode of the second switch transistor is connected with the second voltage node, and a second electrode of the second switch transistor is connected with a first end of the second capacitor and a first electrode of the sixth switch transistor; the first electrode of the sixth switch transistor is connected with the first end of the second capacitor, and a second electrode of the sixth switch transistor is connected with a second end of the second capacitor; the second end of the second capacitor is grounded; a second input of the comparator is connected with the first voltage node, and a third input of the comparator is connected with the second voltage node; one end of the adjustable resistor is connected with the third voltage node, the other end of the adjustable resistor is connected with one end of the first resistor, and the other end of the first resistor is grounded; the Sigma-Delta modulator is connected with the adjustable resistor for adjusting a resistance of the adjustable resistor, so that the adjusted resistance of the adjustable resistor and the first resistor improve frequency tuning accuracy of the RC oscillator; and one end of the filter capacitor is connected with the third voltage node, and the other end of the filter capacitor is grounded to filter high-frequency noise introduced by the Sigma-Delta modulator.

Optionally, the inverting module includes a Schmitt trigger, wherein an input of the Schmitt trigger is connected with an output of the comparator, and an output of the Schmitt trigger is connected with an input of the output module.

Optionally, the output module includes a first inverter and a second inverter, wherein the first inverter is connected in series with the second inverter, the first inverter is connected a gate of the first switch transistor, a gate of the fourth switch transistor and a gate of the sixth switch transistor, and the second inverter is connected with a gate of the second switch transistor, a gate of the third switch transistor and a gate of the fifth switch transistor.

Optionally, the first compensating module includes a seventh switch transistor, an eighth switch transistor, a ninth switch transistor and a tenth switch transistor, wherein the seventh switch transistor and the eighth switch transistor are configured to compensate a leakage current of a switch transistor from a source and a drain to a substrate in a resistor array, and the ninth switch transistor and the tenth switch transistor are configured to compensate a leakage current of a switch transistor from a drain to a source in a capacitor array.

Optionally, a first electrode and a second electrode of the seventh switch transistor are connected with a fourth voltage node, and a gate of the seventh switch transistor is grounded; a first electrode and a second electrode of the eighth switch transistor are connected with a fifth voltage node, and a gate of the eighth switch transistor is grounded; a first electrode of the ninth switch transistor is connected with the third voltage node, and a second electrode and a gate of the ninth switch transistor are grounded; and a first electrode of the tenth switch transistor is connected with the third voltage node, and a second electrode and a gate of the tenth switch transistor are grounded.

Optionally, the second compensating module is configured to adjust an offset of an oscillating frequency of the RC oscillator caused by a temperature variation.

Optionally, the second compensating module includes a second current source, wherein one end of the second current source is connected with the power supply voltage, and the other end of the second current source is connected with the third voltage node.

In an embodiment of the present disclosure, a monolithic integrated chip is provided, including any one of the RC oscillators described above, wherein the RC oscillator is configured to provide a clock signal to a clock using circuit in the monolithic integrated chip.

DETAILED DESCRIPTION

Embodiments of the present disclosure provide an RC oscillator for reducing correlation between oscillating frequency and temperature of the RC oscillator and improving stability and tuning accuracy of an oscillation frequency of the RC oscillator.

A clear and complete description of technical solutions of embodiments of this invention will be given with reference to the accompanying drawings of the embodiments of this invention. Obviously, embodiments described herein merely some embodiments of this invention, but not all of them.

Terms "first", "second", "third", "fourth", etc. in the specification, claims and figures of the present disclosure are used to distinguish similar objects without having to describe a specific order. It should be understood that such calibrated data may be interchanged when it is appropriate, so that the embodiments described herein can be implemented in a sequence other than what is illustrated or described herein. In addition, terms "comprise" and "includes" and their variants are intended to cover a non-exclusive inclusion. For example, a process, method, system, product or device that includes a series of steps or units is not necessarily limited to those steps or units, but may include other steps or units not explicitly listed or inherent to such process, method, product or device.

Figure 1:
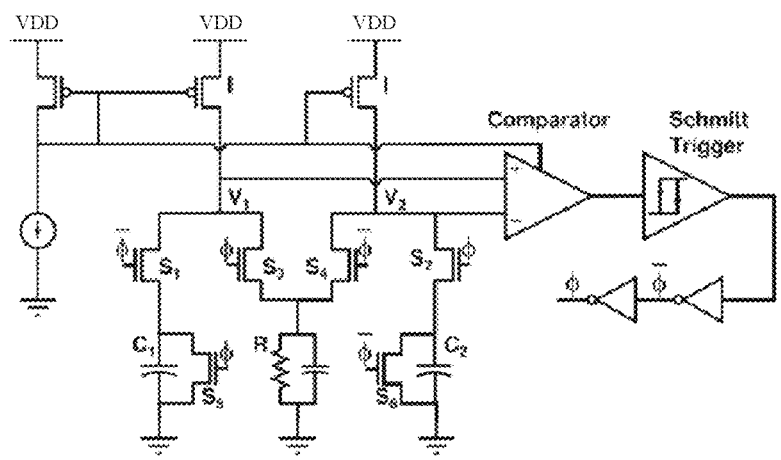
FIG. 1 schematically illustrates a structural diagram of an RC oscillator in existing techniques.
Figure 2:
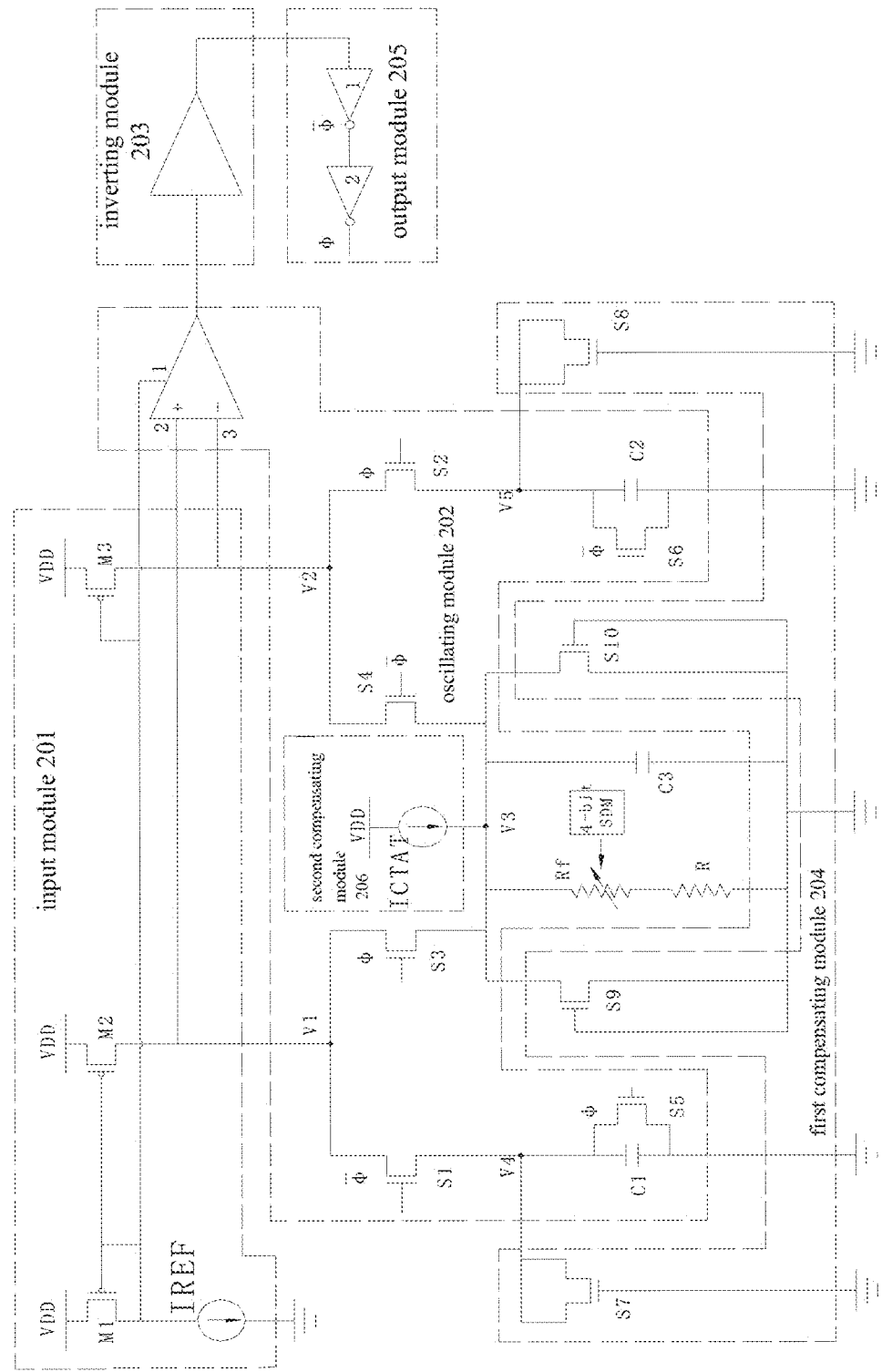
FIG. 2 schematically illustrates a structural diagram of an RC oscillator according to an embodiment.

Referring to FIG. 2, FIG. 2 schematically illustrates a structural diagram of an RC oscillator according to an embodiment. Referring to FIG. 2, the RC oscillator includes an input module 201, an oscillating module 202, an inverting module 203, a first compensating module 204, an output module 205 and a second compensating module 206.

The input module 201 is connected with the oscillating module 202, and configured to provide two-path charging currents and a bias current for the oscillating module 202.

The oscillating module 202 is connected with the inverting module 203, the first compensating module 204 and the second compensating module 206, and configured to output a first high level or a first low level to the inverting module 203 under the control of the two-path charging currents and the bias current, and improve frequency tuning accuracy of the oscillator.

The inverting module 203 is connected with the output module 205, configured to invert the first high level to a second low level or to invert the first low level to a second high level, and output the second low level or the second high level to the output module 205.

The output module 205 is configured to output the second high level and the second low level output by the inverting module 203.

The first compensating module 204 is configured to compensate an oscillation frequency of the oscillating module 202, so as to adjust an oscillation frequency of the RC oscillator and to improve stability of the oscillation frequency of the RC oscillator.

The second compensating module 206 is configured to adjust an offset of the oscillation frequency of the RC oscillator caused by a temperature variation.

Embodiments of the present disclosure are described above in a modular manner, and specific electronic components included in each module are described in detail below.

Transistors used in the embodiments of the present disclosure may be thin film transistors or field effect transistors or other devices having similar characteristics. According to functions in a circuit, the transistors used in the embodiments of the present disclosure are mainly Complementary Metal Oxide Semiconductor (CMOS) transistors. As a source and a drain of the COMS transistor are symmetrical, the source and the drain are interchangeable. In the embodiments of the present disclosure, to distinguish two terminals of the transistor other than a gate, an input of the transistor is referred to as a first end, an output of the transistor is referred to as a second end, and a middle terminal is the gate. In addition, a first switch transistor S1, a second switch transistor S2, a third switch transistor S3, a fourth switch transistor S4, a fifth switch transistor S5 and a sixth switch transistor S6 are all N-type MOS transistors, and a first transistor M1, a second transistor M2 and a third transistor M3 are P-type MOS transistors.

Figure 5:
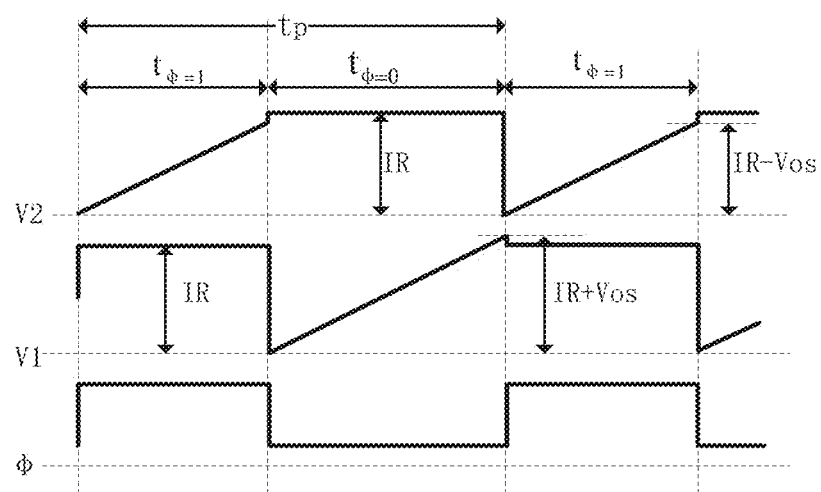
FIG. 5 schematically illustrates a waveform diagram of an RC oscillator according to an embodiment.

First, a basic working principle of the RC oscillator provided by the present disclosure is described. Referring to FIG. 2 and FIG. 5, FIG. 5 schematically illustrates a waveform diagram of an RC oscillator according to an embodiment. When an output clock Φ is low, the first switch transistor S1, the fourth switch transistor S4, and the sixth switch transistor S6 are turned on, and a voltage across a second capacitor C2 is 0. A first current source IREF charges a first capacitor C1, and a voltage of a first voltage node V1 is that across the first capacitor C1, and a voltage of a second voltage node V2 is a reference voltage. As the voltage of the first voltage node V1 is consistent with the voltage across the first capacitor C1, and charging the first capacitor C1 also increases the voltage of the first voltage node V1. When the voltage of the first voltage node V1 is greater than the voltage of the second voltage node V2, an output of the comparator Comparator is inverted, and the output clock Φ changes from the low level to a high level. At this time, the second switch transistor S2, the third switch transistor S3 and the fifth switch transistor S5 are turned on to discharge the voltage across the first capacitor C to 0 V, and the first current source IREF charges the second capacitor C2. At this time, the voltage of the second voltage node V2 is the voltage across the capacitor C2, the voltage of the first voltage node V1 is the reference voltage, and charging the second capacitor C2 also increases the voltage of the second voltage node V2. When the voltage of the second voltage node V2 is greater than the voltage of the first voltage node V1, the output clock Φ is inverted from the high level to a low level. In this way, a periodic clock output is generated.

It should be noted that the first current source IREF charging the first capacitor C1 or the second capacitor C2 may include a current of the first current source IREF being mirrored by the second transistor M2 or the third transistor M3 to obtain a mirror current to charge the first capacitor C1 or the second capacitor C2. In some embodiments, the first capacitor C1 or the second capacitor C2 may be charged in other manners, which is not limited herein.

Referring to FIG. 2, the input module 201 includes a power supply voltage VDD, the first transistor M1 (P-type MOS transistor), the second transistor M2 (P-type MOS transistor), the third transistor M3 (P-type MOS transistor) and the first current source IREF. The power supply voltage VDD is used to provide a voltage for the RC oscillator, and the first current source IREF is a temperature-free current source from a bandgap reference. One end of the first current source IREF is grounded, and the other end of the first current source IREF is connected with a second electrode and a gate of the first transistor M1, a gate of the second transistor M2 and a gate of the third transistor M3. The power supply voltage VDD is connected with a first electrode of the first transistor M1, a first electrode of the second transistor M2 and a first electrode of the third transistor M3, a second electrode of the second transistor M2 is connected with a first voltage node V1 of the oscillator, and a second electrode of the third transistor M3 is connected with a second voltage node V2 of the oscillator. The first current source IREF provides two-path charging currents for the oscillating module 202, that is, the currents mirrored by the second transistor M2 and the third transistor M3 are respectively input to the first voltage node V1 and the second voltage node V2, and the first current source IREF further provides a bias current for the oscillating module 202 (as shown in FIG. 2, the first current source IREF is connected with an interface 1 of the comparator Comparator).

Still referring to FIG. 2, the oscillator module 202 includes the first switch transistor S1, the second switch transistor S2, the third switch transistor S3, the fourth switch transistor S4, the fifth switch transistor S5, the sixth switch transistor S6, the first capacitor C1, the second capacitor C2, the comparator Comparator, the adjustable resistor Rf, the filter capacitor C3 and the Sigma-Delta modulator.

A first electrode of the first switch transistor S1 is connected with the first voltage node V1, and a second electrode of the first switch transistor S1 is connected with a first end of the first capacitor C1 and a first electrode of the fifth switch transistor S5.

The first electrode of the fifth switch transistor S5 is connected with the first end of the first capacitor C1, and a second electrode of the fifth switch S5 is connected with a second end of the first capacitor C1.

The second end of the first capacitor C1 is grounded.

A first electrode of the third switch transistor S3 is connected with the first voltage node V1, and a second electrode of the third switch transistor S3 is connected with a third voltage node V3.

A first electrode of the fourth switch transistor S4 is connected with the second voltage node V2, and a second electrode of the fourth switch transistor S4 is connected with the third voltage node V3.

A first electrode of the second switch transistor S2 is connected with the second voltage node V2, and a second electrode of the second switch transistor S2 is connected with a first end of the second capacitor C3 and a first electrode of the sixth switch transistor S6.

The first electrode of the sixth switch transistor S6 is connected with the first end of the second capacitor C2, and a second electrode of the sixth switch transistor S6 is connected with a second end of the second capacitor C2.

The second end of the second capacitor C2 is grounded.

A second input of the comparator Comparator (as shown in FIG. 2, an interface 2 of the comparator Comparator) is connected with the first voltage node V1, and a third input of the comparator Comparator (as shown in FIG. 2, an interface 3 of the comparator Comparator) is connected with the second voltage node V2.

One end of the adjustable resistor Rf is connected with the third voltage node V3, the other end of the adjustable resistor Rf is connected with one end of the first resistor R, and the other end of the first resistor R is grounded.

The Sigma-Delta modulator is connected with the adjustable resistor Rf for adjusting resistance of the adjustable resistor Rf, so that the adjusted resistance of the adjustable resistor Rf and the first resistor R improve frequency tuning accuracy of the RC oscillator.

One end of the filter capacitor C3 is connected with the third voltage node V3, and the other end of the filter capacitor C3 is grounded to filter high-frequency noise introduced by the Sigma-Delta modulator.

Still referring to FIG. 2, the inverting module 203 includes a Schmitt trigger. The Schmitt trigger is a special gate circuit. Unlike ordinary gate circuits, the Schmitt trigger has two threshold voltages, which are called a positive threshold voltage and a negative threshold voltage. A state of the circuit changes when an input signal rises from a low level to a high level or drops from a high level to a low level. An input voltage that changes the state of the circuit during the transition of the input signal from a low level to a high level, is referred to as the positive threshold voltage, and an input voltage that changes the state of the circuit during the transition of the input signal from a high level to a low level, is referred to as the negative threshold voltage. An input of the Schmitt trigger is connected with the output of the comparator Comparator, and an output of the Schmitt trigger is connected with an input of the output module 205. The Schmitt trigger is used for inverting the clock signal output by the comparator, and sending the inverted clock signal to the output module 205 for output.

Still referring to FIG. 2, the output module 205 includes a first inverter and a second inverter.

The first inverter is connected in series with the second inverter, the first inverter is connected with a gate of the first switch transistor S1, a gate of the fourth switch transistor S4 and a gate of the sixth switch transistor S6, and the second inverter is connected with a gate of the second switch transistor S2, a gate of the third switch transistor S3 and a gate of the fifth switch transistor S5 (Connection relations between the first inverter and the first, the fourth and the sixth switch transistors, and connection relations between the second inverter and the second, the third and the fifth switch transistors are not shown in FIG. 2). When the Schmitt trigger outputs a low level, the first inverter outputs a high level, and the second inverter outputs a low level. When the Schmitt trigger outputs a high level, the first inverter outputs a low level, and the second inverter outputs a high level. For example, when the inverting module 203 outputs 0, the first inverter outputs 1, and the second inverter outputs 0. When the inverting module 203 outputs 1, the first inverter outputs 0, and the second inverter outputs 1. The second low level is obtained by the inverting module 203 inverting the first high level generated by the oscillating module 202, and the second high level is obtained by the inverting module 203 inverting the first low level generated by the oscillating module 202.

Still referring to FIG. 2, in general processes, resistance and capacitance of passive devices usually have a relatively loge temperature coefficient. The resistance and capacitance difference between a low temperature and a high temperature may reach 5% to 10%, which seriously affects accuracy of clock frequency of the RC oscillator. For example, in some embodiments, when an external temperature rises, the capacitance and the resistance in the RC oscillator increase, and an oscillation period becomes larger, which further reduces the oscillation frequency of the RC oscillator. When the external temperature reduces, the capacitance and the resistance in the RC oscillator are reduced, and the oscillation period is shortened, which in turn increases the oscillation frequency of the RC oscillator. To compensate the oscillation frequency deviation caused by the external temperature variation, the RC oscillator may further include the second compensating module 206.

The second compensating module 206 includes a second current source ICTAT whose current has a negative temperature coefficient generated by a bandgap reference circuit. As the current of the second current source ICTAT has a negative temperature coefficient, when the external temperature rises, the current of the second current source CTAT decreases, and thus the reference voltage decreases, which reduces a time required for the charging voltage across the capacitor in the RC oscillator reaching the reference voltage. Accordingly, an inverting cycle of high and low levels is shortened, thereby compensating for the decrease of the oscillation frequency due to increase of the resistance and the capacitance. When the external temperature decreases, the current of the second current source CTAT rises, and thus the reference voltage rises, which increases a time required for the charging voltage across the capacitor in the RC oscillator reaching the reference voltage. Accordingly, an inverting cycle of high and low levels is prolonged, thereby compensating for the increase of the oscillation frequency due to decrease of the resistance and the capacitance. In this way, the stability of the oscillation frequency of the RC oscillator is improved.

Figure 3:
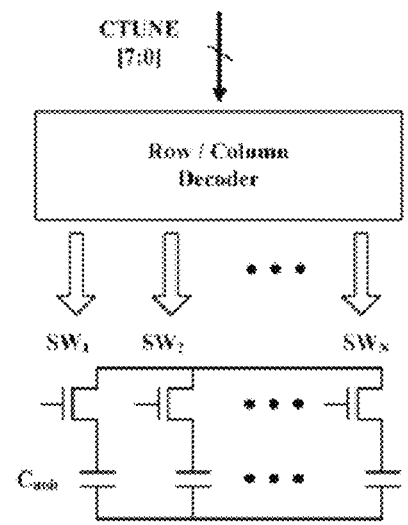
FIG. 3 schematically illustrates a structural diagram of a capacitor array in an RC oscillator according to an embodiment.
Figure 4:
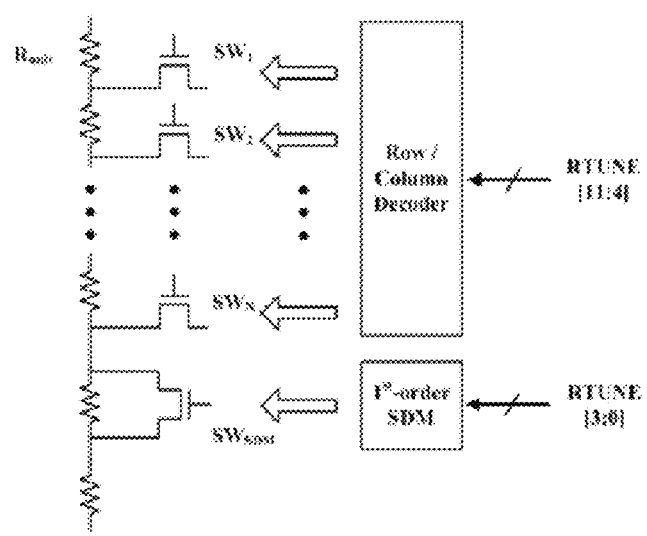
FIG. 4 schematically illustrates a structural diagram of a resistor array in an RC oscillator according to an embodiment.

It should be noted that it is not enough to compensate for a first-order temperature error introduced by passive devices such as resistors and capacitors. It is also necessary to consider influence of leakage current of the transistor with temperature variations. To enable the RC oscillator to operate at a required precise frequency under various process corners, temperatures and voltages, it is usually necessary to design the resistors and the capacitors in the RC oscillator as arrays of switch transistors and resistor/capacitor components, to precisely tune the oscillation frequency of the RC oscillator. Referring to FIG. 3 and FIG. 4, FIG. 3 schematically illustrates a structural diagram of a capacitor array in an RC oscillator according to an embodiment, and FIG. 4 schematically illustrates a structural diagram of a resistor array in an RC oscillator according to an embodiment. The introduction of a large number of switch transistors provides the possibility to accurately tune resistor d capacitor parameters and frequency; but also increases influence of leakage current on the oscillation frequency of the RC oscillator. In advanced processes, the leakage effect of transistors is more significant, and the influence on the RC oscillator is also greater. Generally, a leakage current of a transistor increases with the increase of temperature, and has an exponential nonlinear trend, which cannot be effectively eliminated by the first-order compensation of the CTAT current.

Therefore, in some embodiments, the compensating module 204 includes a seventh switch transistor S7, an eighth switch transistor S8, a ninth switch transistor S9 and a tenth switch transistor S10.

Due to external factors such as production process, even when the transistors are in a turned-off state, a slight leakage may occur. As the RC oscillator in embodiments of the present disclosure includes the first capacitor C1, the second capacitor C2, the adjustable resistor Rf, and the first resistor R, to balance the leakage current of the switch transistor in the capacitor array and the leakage current of the switch transistor in the resistor array, a leakage current of a switch transistor in the resistor array of the adjustable resistor Rf and the first resistor R (i.e., a leakage current of the transistor in the resistor array as shown in FIG. 4) needs to be simulated on the first capacitor C1 and the second capacitor C2. Therefore, the seventh switch transistor S7 and the eighth switch transistor S8 are provided for compensating the leakage current of the transistor from its source and drain to its substrate in the resistor array of the adjustable resistor Rf and the first resistor R, the first electrode and the second electrode of the seventh switch transistor S7 are connected with the fourth voltage node V4, the gate of the seventh switch transistor S7 is grounded, the first electrode and the second electrode of the eighth switch transistor S8 are connected with the fifth voltage node V5, and the gate of the eighth switch transistor S8 is grounded.

Similarly, the ninth switch transistor S9 and the tenth switch transistor S10 are provided for compensating for the leakage current of the switch transistor from its drain to its source in the capacitor array, that is, a leakage current of a switch transistor from its drain to its source (i.e., a leakage current of the transistor in the capacitor array as shown in FIG. 3) in the capacitor arrays of the first capacitor C1 and the second capacitor C2 is simulated on the adjustable resistor Rf and the first resistor R. A first electrode of the ninth switch transistor S9 is connected with the third voltage node V3, and a second electrode and a gate of the ninth switch transistor S9 are grounded. A first electrode of the tenth switch transistor S10 is connected with the third voltage node V4, and a second electrode and a gate of the tenth switch transistor S10 are grounded.

By employing the seventh switch transistor S7, the eighth switch transistor S8, the ninth switch transistor S9 and the tenth switch transistor S10, a high-order frequency error introduced by a change of the transistor leakage current in the resistor array and the capacitor array with a temperature variation is compensated, which improves precision of temperature compensation and further enhances stability of oscillation frequency of the RC oscillator.

It should be noted that the number of the seventh switch transistor S7, the number of the eighth switch transistor S8, the number of the ninth switch transistor S9 and the number of the tenth switch transistor S10 are not limited herein. The switch transistor may be a single transistor or include a plurality of switch transistors arranged in an array, as long as the transistors can match arrays of the resistors and the capacitors in the RC oscillator and achieve the object of the present disclosure.

Although the present disclosure has been disclosed above with reference to preferred embodiments thereof, it should be understood that the disclosure is presented by way of example only, and not limitation. Those skilled in the art can modify and vary the embodiments without departing from the spirit and scope of the present disclosure.

What is claimed is:

1. A resistor-capacitor (RC) oscillator, comprising an input module, an oscillating module, an inverting module, a first compensating module, a second compensating module and an output module,
    wherein the input module is connected with the oscillating module, and configured to provide two-path charging currents and a bias current for the oscillating module;
    the oscillating module is connected with the inverting module, the first compensating module and the second compensating module, and configured to output a first high level or a first low level to the inverting module under the control of the two-path charging currents and the bias current;
    the inverting module is connected with the output module, configured to invert the first high level to a second low level or to invert the first low level to a second high level, and output the second low level or the second high level to the output module;
    the output module is configured to output the second high level and the second low level;
    the first compensating module and the second compensating module are configured to improve stability of an oscillation frequency of the oscillator; and
    the first compensating module comprises a seventh switch transistor, an eighth switch transistor, a ninth switch transistor and a tenth switch transistor, wherein the seventh switch transistor and the eighth switch transistor are configured to compensate a leakage current of a switch transistor from its source and drain to its substrate in a resistor array, and the ninth switch transistor and the tenth switch transistor are configured to compensate a leakage current of a switch transistor from its drain to its source in a capacitor array.

2. The RC oscillator according to claim 1, wherein the input module comprises a first current source, a power supply voltage, a first transistor, a second transistor and a third transistor,
    wherein one end of the first current source is grounded, and the other end of the first current source is connected with a second electrode and a gate of the first transistor, a gate of the second transistor, and a gate of the third transistor, the power supply voltage is connected with a first electrode of the first transistor, a first electrode of the second transistor, and a first electrode of the third transistor, a second electrode of the second transistor is connected with a first voltage node of the oscillator, and a second electrode of the third transistor is connected with a second voltage node of the oscillator.

3. The RC oscillator according to claim 2, wherein the oscillator module comprises a first switch transistor, a second switch transistor, a third switch transistor, a fourth switch transistor, a fifth switch transistor, a sixth switch transistor, a first capacitor, a second capacitor, a comparator, an adjustable resistor, a filter capacitor and a Sigma-Delta modulator,
    wherein a first electrode of the first switch transistor is connected with the first voltage node, and a second electrode of the first switch transistor is connected with a first end of the first capacitor and a first electrode of the fifth switch transistor;
    the first electrode of the fifth switch transistor is connected with the first end of the first capacitor, and a second electrode of the fifth switch transistor is connected with a second end of the first capacitor;
    the second end of the first capacitor is grounded;
    a first electrode of the third switch transistor is connected with the first voltage node, and a second electrode of the third switch transistor is connected with a third voltage node;
    a first electrode of the fourth switch transistor is connected with the second voltage node, and a second electrode of the fourth switch transistor is connected with the third voltage node;
    a first electrode of the second switch transistor is connected with the second voltage node, and a second electrode of the second switch transistor is connected with a first end of the second capacitor and a first electrode of the sixth switch transistor;
    the first electrode of the sixth switch transistor is connected with the first end of the second capacitor, and a second electrode of the sixth switch transistor is connected with a second end of the second capacitor;
    the second end of the second capacitor is grounded;

a second input of the comparator is connected with the first voltage node, and a third input of the comparator is connected with the second voltage node;

one end of the adjustable resistor is connected with the third voltage node, the other end of the adjustable resistor is connected with one end of a first resistor, and the other end of the first resistor is grounded;

the Sigma-Delta modulator is connected with the adjustable resistor for adjusting resistance of the adjustable resistor, so that the adjusted resistance of the adjustable resistor and the first resistor improve frequency tuning accuracy of the RC oscillator; and one end of the filter capacitor is connected with the third voltage node, and the other end of the filter capacitor is grounded to filter high-frequency noise introduced by the Sigma-Delta modulator.

4. The RC oscillator according to claim 3, wherein the inverting module comprises a Schmitt trigger, wherein an input of the Schmitt trigger is connected with an output of the comparator, and an output of the Schmitt trigger is connected with an input of the output module.

5. The RC oscillator according to claim 3, wherein the output module comprises a first inverter and a second inverter, wherein the first inverter is connected in series with the second inverter, the first inverter is connected with a gate of the first switch transistor, a gate of the fourth switch transistor and a gate of the sixth switch transistor, and the second inverter is connected with a gate of the second switch transistor, a gate of the third switch transistor and a gate of the fifth switch transistor.

6. The RC oscillator according to claim 3, wherein a first electrode and a second electrode of the seventh switch transistor are connected with a fourth voltage node, and a gate of the seventh switch transistor is grounded;

a first electrode and a second electrode of the eighth switch transistor are connected with a fifth voltage node, and a gate of the eighth switch transistor is grounded;

a first electrode of the ninth switch transistor is connected with the third voltage node, and a second electrode and a gate of the ninth switch transistor are grounded; and a first electrode of the tenth switch transistor is connected with the third voltage node, and a second electrode and a gate of the tenth switch transistor are grounded.

7. The RC oscillator according to claim 1, wherein the second compensating module is configured to adjust an offset of an oscillating frequency of the RC oscillator caused by a temperature variation.

8. The RC oscillator according to claim 3, wherein the second compensating module comprises a second current source, wherein one end of the second current source is connected with the power supply voltage, and the other end of the second current source is connected with the third voltage node.

9. A monolithic integrated chip, comprising the RC oscillator according to claim 1, wherein the RC oscillator is configured to provide a clock signal to a clock using circuit in the monolithic integrated chip.

* * * * *